US009431434B2

(12) United States Patent
Liu et al.

(10) Patent No.: US 9,431,434 B2
(45) Date of Patent: Aug. 30, 2016

(54) PIXEL UNIT AND METHOD OF MANUFACTURING THE SAME, ARRAY SUBSTRATE AND DISPLAY DEVICE

(71) Applicant: BOE Technology Group Co., Ltd., Beijing (CN)

(72) Inventors: Zheng Liu, Beijing (CN); Im Jang Soon, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/160,778

(22) Filed: Jan. 22, 2014

(65) Prior Publication Data

US 2014/0209912 A1 Jul. 31, 2014

(30) Foreign Application Priority Data

Jan. 25, 2013 (CN) .......................... 2013 1 0030534

(51) Int. Cl.
*H01L 27/12* (2006.01)
*H01L 21/447* (2006.01)
*H01L 21/324* (2006.01)

(52) U.S. Cl.
CPC ................................ *H01L 27/1255* (2013.01)

(58) Field of Classification Search
CPC ........... H01L 27/1288; H01L 27/1277; H01L 27/1229; H01L 27/1255; H01L 2251/566
USPC ........................................ 438/151, 158, 137
See application file for complete search history.

(56) References Cited

U.S. PATENT DOCUMENTS 4,962,065 A * 10/1990 Brown .............. H01L 21/28185 148/DIG. 114
5,306,651 A 4/1994 Masumo et al.
6,100,119 A 8/2000 Jang et al.
2001/0005019 A1* 6/2001 Ishikawa ........... G02F 1/136213 257/59
2002/0197831 A1* 12/2002 Todd ...................... B82Y 10/00 438/528
2006/0076618 A1* 4/2006 Kang ............................ 257/336

(Continued)

FOREIGN PATENT DOCUMENTS

CN 1725510 A 1/2006
CN 101083261 A 12/2007

(Continued)

OTHER PUBLICATIONS

First Chinese Office Action for Chinese Patent Application No. 201310030534.4, dated Dec. 1, 2014, 13 pages.

(Continued)

*Primary Examiner* — Julio J Maldonado
(74) *Attorney, Agent, or Firm* — Westman, Champlin & Koehler, P.A.

(57) ABSTRACT

Embodiments of the present invention provide a method of manufacturing a pixel unit, in which only a single patterning process and a single doping process are performed on a polysilicon layer so as to form heavily doped regions of a thin film transistor and a lower electrode of a storage capacitor respectively, thereby reducing numbers of photolithography and masking processes required to manufacture a LTPS-TFT, shortening time periods for development and mass production, and reducing complexity of processes as well as monitoring difficulty, and decreasing the production cost. The present invention further provides a pixel unit manufactured according to the method, an array substrate and a display device including the same.

8 Claims, 8 Drawing Sheets

106 107
108

(56) References Cited

U.S. PATENT DOCUMENTS

| | | | | |
|---|---|---|---|---|
| 2006/0211187 | A1* | 9/2006 | Choi | H01L 21/28123 438/197 |
| 2007/0278480 | A1 | 12/2007 | Hwang et al. | |
| 2008/0283840 | A1* | 11/2008 | Doi et al. | 257/66 |
| 2010/0039030 | A1* | 2/2010 | Winters et al. | 313/505 |
| 2011/0199564 | A1* | 8/2011 | Moriwaki | G02F 1/136227 349/122 |
| 2011/0291101 | A1* | 12/2011 | Choi | 257/72 |
| 2012/0129301 | A1* | 5/2012 | Or-Bach | G11C 8/16 438/129 |
| 2012/0146031 | A1* | 6/2012 | Lee | 257/59 |

FOREIGN PATENT DOCUMENTS

| | | |
|---|---|---|
| CN | 101083561 A | 12/2007 |
| CN | 102097368 A | 6/2011 |

OTHER PUBLICATIONS

Second Office Action for Chinese Patent Application 201310030534.4, dated May 11, 2015, 7 pages.

Third Chinese Office Action for Chinese Patent Application No. 201310030534.4,dated Sep. 15, 2015, 7 pages.

Rejection Decision of the Application for Chinese Patent Application No. 201310030534.4, dated Mar. 9, 2016, 11 pages.

Rexamination Notification from Chinese Patent Application No. 201310030534.4, dated Jul. 6, 2016, 15 pages.

* cited by examiner

PIXEL UNIT AND METHOD OF MANUFACTURING THE SAME, ARRAY SUBSTRATE AND DISPLAY DEVICE

CROSS-REFERENCE TO RELATED APPLICATION

This application claims the benefit of Chinese Patent Application No. 201310030534.4 filed on Jan. 25, 2013 in the State Intellectual Property Office of China, the whole disclosure of which is incorporated herein by reference.

BACKGROUND OF THE INVENTION

1. Field of the invention

The present invention relate to a field of display technology, and more particularly, to a pixel unit including a thin film transistor and a method of manufacturing the same, an array substrate, and a display device.

2. Description of the Related Art

With development of display technologies, there are increasing user demands on display devices, and TFT-LCD (Thin Film Transistor-Liquid Crystal Display) has a wide range of applications in products such as a mobile phone, a liquid crystal display, a tablet computer or the like. Further, with increasing popularization of display devices, requirements on color quality, contrast, angle of visibility, response speed and low power consumption of display devices are on increase. Thus, an OLED (Organic Light-Emitting Diode) display has begun to be accepted by the users.

LTPS-TFTs (Low Temperature Polycrystalline Silicon-Thin Film Transistor) are widely used in TFT-LCDs of high resolution and current-driven TFT-OLEDs due to advantages such as regular arrangement and high mobility of atoms of the low temperature polycrystalline silicon, small device size and high driving ability.

However, since processes such as excimer laser crystallization, ion implantation and activation of doped particles need to be performed when manufacturing LTPS-TFTs in the prior art, generally, photolithography and masking processes need to be performed 8-12 times so as to finish manufacture of the LTPS-TFT, resulting in long time periods for development and mass production, difficulty in control of processes and high production costs.

SUMMARY OF THE INVENTION

Taking into account the above and other defects in the prior art, embodiments of the present invention provide a pixel unit including a thin film transistor and a method of manufacturing the same, an array substrate, and a display device, thereby reducing numbers of photolithography masking processes required to manufacture a Low Temperature Polycrystalline Silicon-Thin Film Transistor (LTPS-TFT), shortening time periods for development and mass production, reducing complexity of processes as well as monitoring difficulty, and decreasing the production cost.

According to one aspect of the present invention, there is provided a method of manufacturing a pixel unit, including steps of:

forming a polysilicon layer on a substrate;

performing a single patterning process on the polysilicon layer so as to form an active region of a thin film transistor and a lower electrode region of a storage capacitor; and performing a single doping process on the active region and lower electrode region so as to form heavily doped regions of the thin film transistor and a lower electrode of the storage capacitor respectively.

According to another aspect of the present invention, there is provided a pixel unit, including:

a substrate; and a thin film transistor and a storage capacitor formed on the substrate, wherein heavily doped regions of the thin film transistor and a lower electrode of the storage capacitor have the same materials and are formed simultaneously through a single patterning process and a single doping process.

According to a further aspect of the present invention, there is provided an array substrate including a plurality of pixel units as described above.

According to a still further aspect of the present invention, there is provided a display device including the array substrate as described above.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
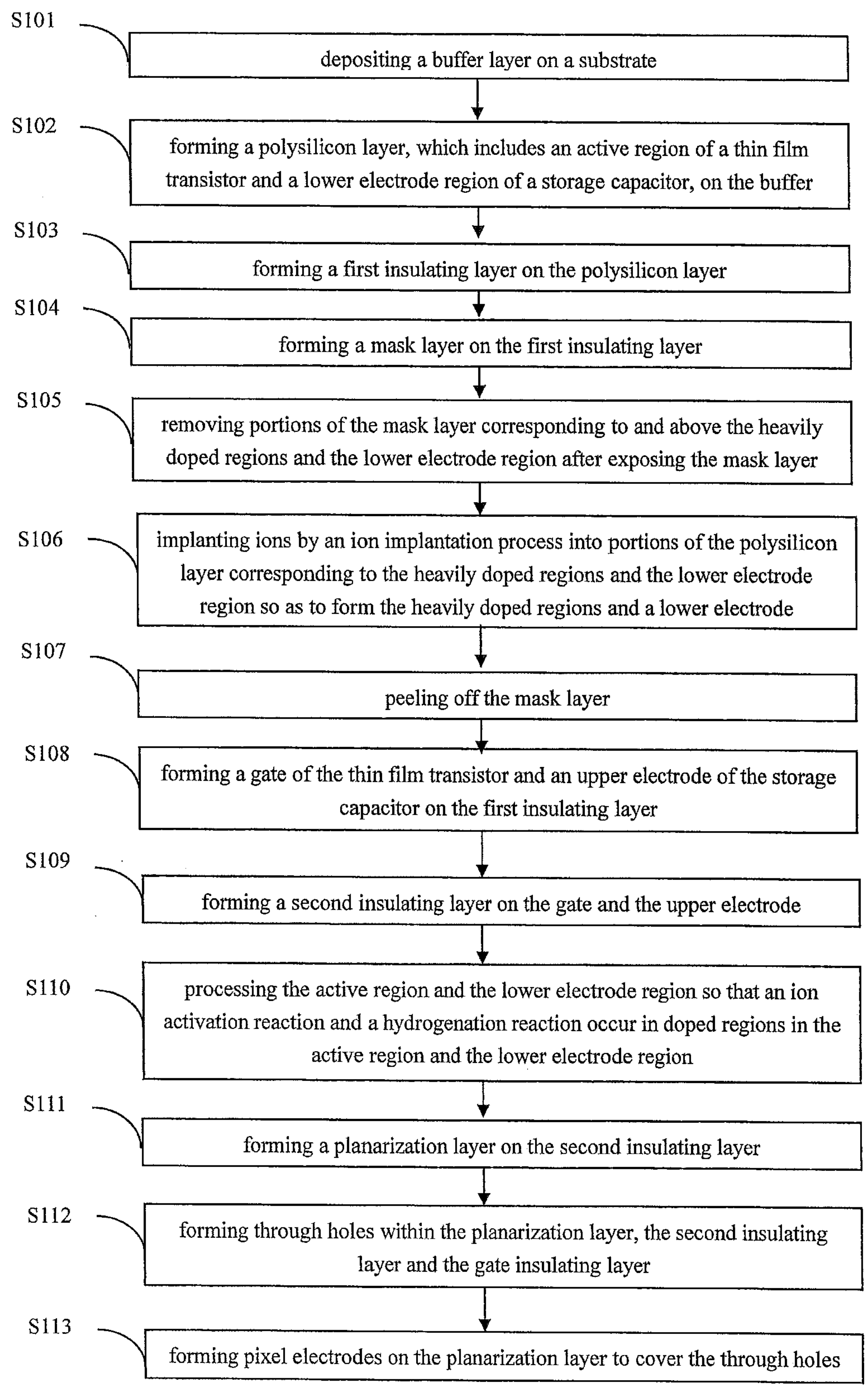
FIG. 1 is a flow chart of a method of manufacturing a pixel unit including a thin film transistor according to an embodiment of the present invention.

Exemplary embodiments of the present invention will be described hereinafter in detail with reference to the attached drawings, wherein the like reference numerals refer to the like elements. The present invention may, however, be embodied in many different forms and should not be construed as being limited to the embodiment set forth herein; rather, these embodiments are provided so that the present invention will be thorough and complete, and will fully convey the concept of the disclosure to those skilled in the art.

It is noted that terms "upper" and "lower" in the present invention are used to describe the present invention with respect to the drawing, and thus are not limitative.

An embodiment of the present invention provides a method of manufacturing a pixel unit, including steps of:

forming a polysilicon layer on a substrate;

performing a single patterning process on the polysilicon layer so as to form an active region of a thin film transistor and a lower electrode region of a storage capacitor; and performing a single doping process on the active region and lower electrode region so as to form heavily doped regions of the thin film transistor and a lower electrode of the storage capacitor respectively.

The doping process may include steps of:

forming a mask layer on the polysilicon layer;

after exposing the mask layer, removing portions of the mask layer corresponding to and over the heavily doped regions in the active region, such as a source region and a drain region of the thin film transistor, and a lower electrode region of the storage capacitor;

implanting ions by way of a doping process such as an ion implantation into portions of the polysilicon layer corresponding to the heavily doped regions and the lower electrode region, so that the heavily doped regions of the thin film transistor and a lower electrode of the storage capacitor are formed.

As shown in FIG. 1, there is shown a flow chart of a method of manufacturing a pixel unit according to an embodiment of the present invention.

In step S101, a buffer layer is deposited on a substrate.

Figure 2:
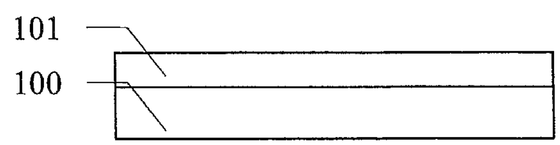
FIG. 2 shows the structure after forming a buffer layer on a substrate according to the method.

As shown in FIG. 2, a buffer layer 101 is formed on a pre-cleaned substrate 100 through processes such as PECVD (Plasma Enhanced Chemical Vapor Deposition), LPCVD (Low Pressure Chemical Vapor Deposition), APCVD (Atmospheric Pressure Chemical Vapor Deposition), ECR-CVD(Electron Cyclotron Resonance-Chemical Vapor Deposition), sputtering, or the like, in order to prevent impurities contained in the substrate 100 from diffusing into the active region, thereby avoiding adverse effects on characteristics such as threshold voltages and leakage currents of TFT elements.

It is noted that, material of the buffer layer 101 may be silicon oxide and/or silicon nitride, that is, the buffer layer 101 may be one layer of silicon oxide or silicon nitride, or a lamination thereof.

Further, the thickness of the buffer layer 101 may be within a range of 300 angstroms to 10,000 angstroms, preferably, within a range of 500 angstroms to 4,000 angstroms, and a temperature for depositing the buffer layer 101 is not higher than 600° C., that is, the deposition temperature is 600° C. or lower.

It is noted that, since contents of metal impurities such as aluminum, barium, sodium, etc. are higher in conventional alkali glasses, and the metal impurities are easily diffused during high temperature processing, the substrate 101 is preferably an alkali-free glass substrate.

It is noted that, a buffer layer may be alternatively formed on the substrate, and preferably in the present embodiment, a buffer layer is formed on the substrate so as to prevent the impurities in the glass substrate from adversely affecting the polysilicon layer.

In step S102, a polysilicon layer, which includes an active region of a thin film transistor and a lower electrode region of a storage capacitor, is formed on the buffer layer.

Figure 3:
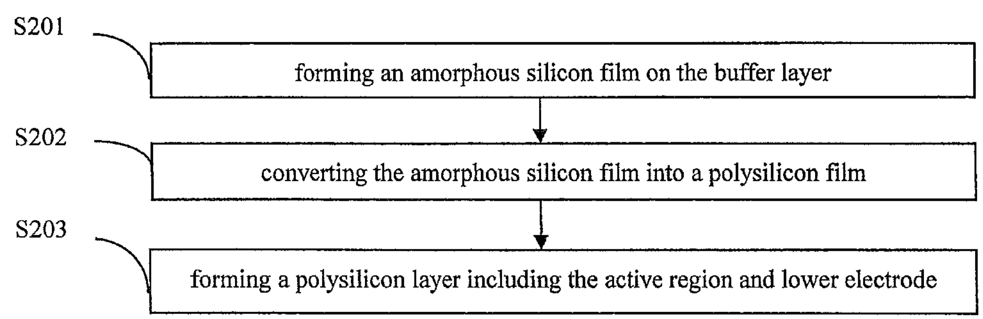
FIG. 3 is a flow chart of forming a polysilicon layer including an active region of the thin film transistor and a lower electrode region of a storage capacitor on the substrate according to the method.

Exemplarily, as shown in FIG. 3, the step of forming a polysilicon layer, which includes an active region 102 of a thin film transistor and a lower electrode region 103 of a storage capacitor, on the buffer layer 101, specifically includes following step S201 to S203:

In step S201, an amorphous silicon film is formed on the buffer layer.

Figure 4:
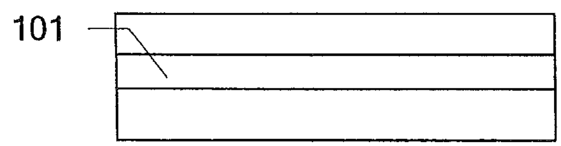
FIG. 4 shows the structure after forming a polysilicon layer on the buffer layer according to the method.

As shown in FIG. 4, methods for forming the amorphous silicon film on the buffer layer 101 include processes such as PECVD, LPCVD, APCVD, ECR-CVD, sputtering, or the like, and a temperature for depositing the amorphous silicon film is not higher than 600° C., that is, the deposition temperature is 600° C. or lower.

In step S202, the amorphous silicon film is converted into a polysilicon film.

The amorphous silicon film is converted into a polysilicon film through a crystallization process after the amorphous silicon film is deposited on the buffer layer 101.

The step of converting the amorphous silicon film into a polysilicon film through a crystallization process may include:

converting the amorphous silicon film into the polysilicon film through one or more of an excimer laser crystallization process, a metal induced crystallization process, and a solid phase crystallization process.

It is noted that, the processes for manufacturing the pixel unit may be varied depending on different crystallization processes, and processes such as heat treatment for dehydrogenation, deposition of induced metals, heat treatment for crystallization, doping of source and drain regions, activation of doped impurities and the like may be added if necessary, the present invention is, however, not limited to this.

In step S203, there is formed a polysilicon layer including the active region and the lower electrode region.

Figure 5:
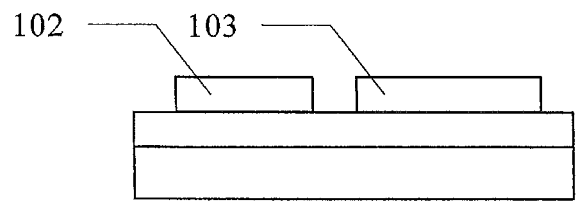
FIG. 5 shows the structure after forming the active region and the lower electrode region within the polysilicon layer according to the method.

As shown in FIG. 5, after step S203, a polysilicon layer is formed through a patterning process so as to include the active region 102 and the lower electrode region 103. Specifically, the patterning process may include coating of photoresist, exposing, developing, etching and removing the photoresist, or the like. The etching process may be a dry etching process such as plasma etching, reactive ion etching, inductively coupled plasma etching or the like, and gases for etching may be gases including fluorine or chlorine, such as $CF_4$, $CHF_3$, $SF_6$, $CCl_2F_2$, or mixed gases of the above gases and $O_2$.

It is noted that, thicknesses of the active region 102 and the lower electrode 103 may be within a range of 100 angstroms to 3,000 angstroms, preferably, within a range of 500 angstroms to 1,000 angstroms.

Next, in step S103, a first insulating layer is formed on the polysilicon layer.

Figure 6:
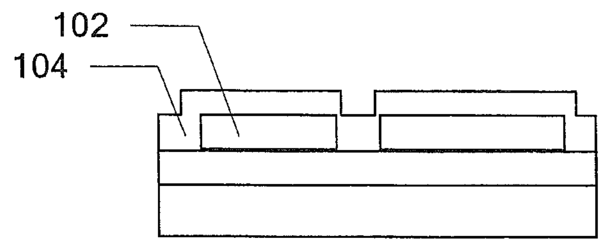
FIG. 6 shows the structure after forming a first insulating layer on the polysilicon layer according to the method.

As shown in FIG. 6, a first insulating layer 104 is formed on the polysilicon layer by using processes such PECVD, LPCVD, APCVD, ECR-CVD, sputtering, or the like, so that the active region 102 will not be damaged and thus performances of the pixel unit will not be detrimentally affected when forming a source and a drain. Further, a temperature for depositing the first insulating layer 104 is not higher than 600° C., that is, the deposition temperature is 600° C. or lower.

In accordance with one embodiment of the present invention, the first insulating layer 104 may be used as a gate insulating layer of the thin film transistor and a dielectric layer of the storage capacitor, and its thickness can be varied correspondingly according to specific design of the thin film transistor. In general, the thickness of first insulating layer 104 may be within a range of 500 angstroms to 2,000 angstroms, and preferably, within a range of 600 angstroms to 1,500 angstroms. Material of the first insulating layer 104 may be silicon oxide and/or silicon nitride, that is, the first insulating layer 104 may be one layer of silicon oxide or silicon nitride, or a lamination thereof.

In step S104, a mask layer is formed on the first insulating layer.

Figure 7:
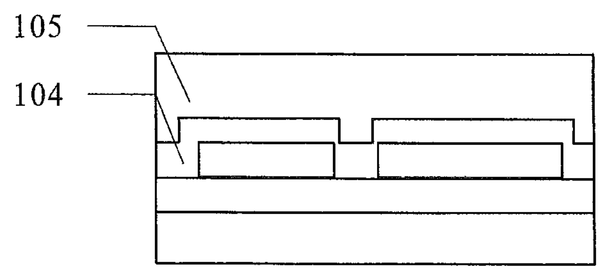
FIG. 7 shows the structure after forming a mask layer on the first insulating layer according to the method.

As shown in FIG. 7, a mask layer 105 is formed on the first insulating layer 104 by using processes such PECVD, LPCVD, APCVD, ECR-CVD, sputtering, or the like.

In step S105, after exposing the mask layer, portions of the mask layer corresponding to and over the heavily doped regions and the lower electrode region are removed.

Figure 8:
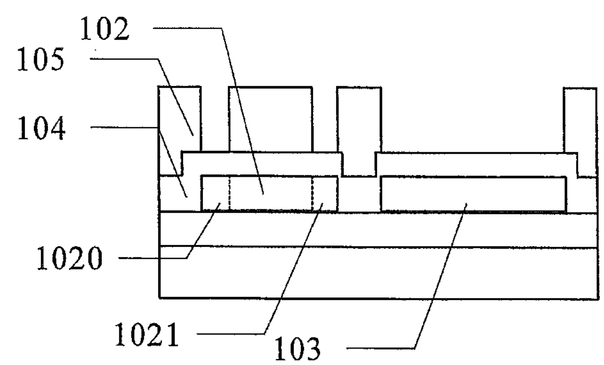
FIG. 8 shows the structure after exposing the mask layer and removing portions thereof according to the method.

As shown in FIG. 8, after the mask layer 105 has formed on the first insulating layer 104 and then is exposed, portions of the mask layer 105 corresponding to and over the heavily doped regions 1020, 1021 in the active region 102 and the lower electrode region 103 of the storage capacitor are removed.

In step S106, ions are implanted by way of an ion implantation process into portions of the polysilicon layer corresponding to the heavily doped regions and the lower electrode region, so that the heavily doped regions of the thin film transistor and the lower electrode of the storage capacitor are formed respectively.

Figure 9:
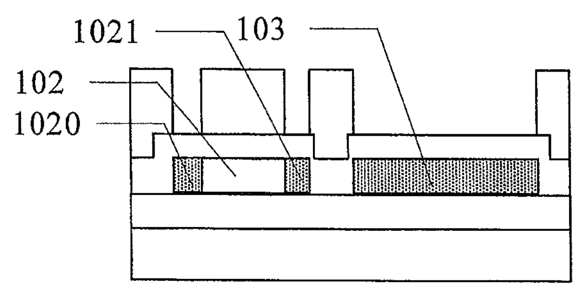
FIG. 9 shows the structure after performing a doping process according to the method.

In accordance with one embodiment of the present invention as shown in FIG. 9, ions are implanted by way of an ion implantation process into portions of the polysilicon layer corresponding to a portion of the active region and the lower electrode region 103, so that the heavily doped regions 1020, 1021 of the thin film transistor and the lower electrode of the storage capacitor are formed. The ion implantation process may be an ion implantation process using a mass analyzer, an ion cloud implantation process not using a mass analyzer, a plasma ion implantation process, or a solid state diffused implantation process. Preferably, the ion implantation process is an ion cloud implantation process, which performs a large dosage implantation in portions of the polysilicon layer corresponding to the heavily doped regions 1020, 1021 and the lower electrode region 103 so as to form the heavily doped regions 1020, 1021 such as source region and drain region of the thin film transistor, and the lower electrode of the storage capacitor.

It is noted that, the ion implantation process may be performed by using gases containing boron or phosphorus elements as required when preparing the thin film transistor, thereby forming a P-channel thin film transistor or N-channel thin film transistor.

For example, a mixed gas of $B_2H_6$ in a range of 5% to 15% by weight and $H_2$ in a range of 85% to 95% by weight is used as an implantation gas, and energy for the ion implantation is 10 kev to 200 kev, and preferably, is 40 kev to 100 kev. A dosage for the ion implantation is $1\times10^{11}$ to $1\times10^{20}/cm^3$, and preferably, is $1\times10^{13}$ to $8\times10^{15}/cm^3$. Alternatively, when a mixed gas of $PH_3$ in a range of 5% to 15% by weight and $H_2$ is used as an implantation gas, the same effect of forming the heavily doped regions 1020, 1021 of the thin film transistor and the lower electrode of the storage capacitor can be achieved as in the above case in which the mixed gas of $H_2$ in a range of 85% to 95% by weight and $B_2H_6$ is used as the implantation gas.

It is noted that, after forming the heavily doped regions, a patterning process and doping process may be added to form one lightly doped region on inner side of each of the two heavily doped regions so as to obtain a five-region LTPS-TFT, thereby improving performances of the TFT.

Next, in step S107, the mask layer is peeled off.

Figure 10:
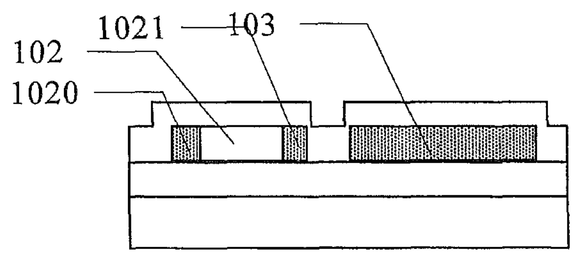
FIG. 10 shows the structure after peeling off the mask layer according to the method.

As shown in FIG. 10, the mask layer 105 is ashed and peeled off after the step S106.

In step S108, a gate of the thin film transistor and an upper electrode of the storage capacitor are formed on the first insulating layer.

Figure 11:
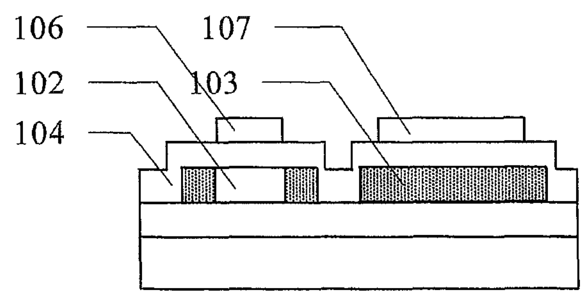
FIG. 11 shows the structure after forming a gate of the thin film transistor and an upper electrode of the storage capacitor according to the method.

As shown in FIG. 11, after forming the active region 102 and the lower electrode 103 of the storage capacitor, a metal layer is formed on the first insulating layer 104 through processes such as sputtering, thermal evaporation, PECVD, LPCVD, APCVD or ECR-CVD, and a gate 106 of the thin film transistor and the upper electrode 107 of the storage capacitor are formed respectively on the gate insulating layer and the dielectric layer of the storage capacitor through a dry or wet etching process.

Materials of the gate 106 and the upper electrode 107 are selected from electrically conductive materials such as metal and metal alloy, and thicknesses of the gate 106 and the upper electrode 107 are in a range of 1,000 angstroms to 8,000 angstroms, and preferably, in a range of 2,500 angstroms to 4,000 angstroms.

In step S109, a second insulating layer is formed on the gate and the upper electrode.

Figure 12:
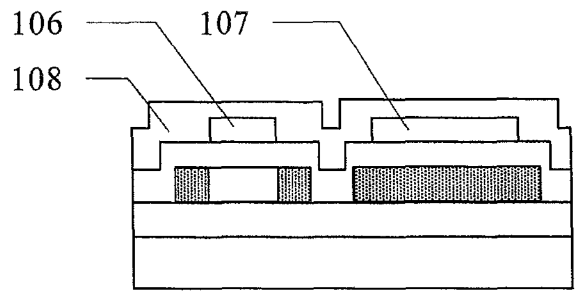
FIG. 12 shows the structure after forming a first insulating layer on the gate and the upper electrode according to the method.

As shown in FIG. 12, a second insulating layer 108 is formed on the gate 106 and the upper electrode 107 through processes such as sputtering, PECVD, LPCVD, APCVD or ECR-CVD, and the thickness of the second insulating layer 108 may be in a range of 3,000 angstroms to 9,000 angstroms, and preferably, in a range of 4,000 angstroms to 6,000 angstroms.

It is noted that, material of the second insulating layer 108 may be silicon oxide and/or silicon nitride, that is, the second insulating layer 108 may be one layer of silicon oxide or silicon nitride, or a lamination thereof.

In step S110, the active region and the lower electrode region are processed so that an ion activation reaction and a hydrogenation reaction occur in the doped regions and the lower electrode region.

For example, an annealing process may be used to process the active region 102 and the lower electrode region 103 so that the ion activation reaction and the hydrogenation reaction occur in the heavily doped regions 1020, 1021 and the lower electrode region 103, thereby forming the source and drain of the thin film transistor and the lower electrode of the storage capacitor. The annealing process may be RTA (Rapid Thermal Annealing), ELA (Excimer Laser Annealing) or furnace annealing. For example, in a furnace annealing, an annealing temperature is 400° C. to 600° C., an annealing atmosphere is nitrogen, hydrogen or vacuum, and an annealing time is 0.5 hour to 10 hours. Alternatively, if the annealing temperature is higher, the annealing time may be shortened to be below 2 hours.

In the method of manufacturing a pixel unit proposed in the present invention, only a single annealing process is performed so as to simultaneously achieve the ion activation reaction and the hydrogenation reaction, which enable ions within the heavily doped regions 1020, 1021 and the lower electrode region 103 to be converted from an irregular arrangement into a regular arrangement, thereby improving conductivity and performances of the pixel unit.

It is noted that, the ion activation reaction and the hydrogenation reaction can be achieved only performing the step S110 after the step S107. Further, since material of the insulating layer 108 contains hydrogen element, which can be provided directly for the hydrogenation reaction of the active region 102 and the lower electrode region 103 so as to save resources, the annealing process is preferably performed after the step S109 of forming the second insulating layer 108.

In step S111, a planarization layer is formed on the second insulating layer.

Figure 13:
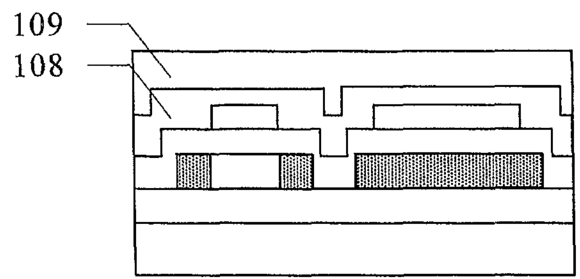
FIG. 13 shows the structure after forming a planarization layer on the first insulating layer according to the method.

As shown in FIG. 13, a planarization layer 109 is formed on the second insulating layer 108. The planarization layer 109 may be, for example, an organic planarization layer, material of which may be acrylic, and the thickness of the planarization layer 109 may be in a range of 8,000 angstroms to 20,000 angstroms.

In step S112, through holes are formed within the planarization layer, the second insulating layer and the gate insulating layer.

Figure 14:
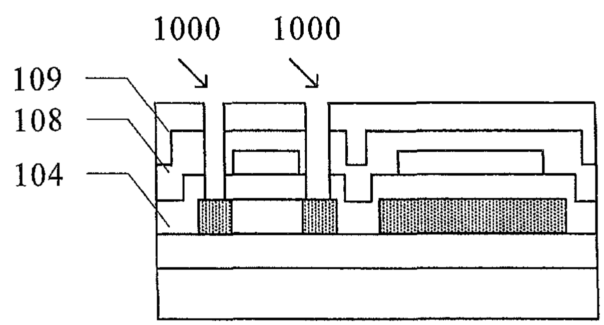
FIG. 14 shows the structure after forming through holes according to the method.

As shown in FIG. 14, after forming the planarization layer 109 on the second insulating layer 108, through holes 1000 are formed within the planarization layer 109, the second insulating layer 108 and the gate insulating layer 104. A process for forming the through holes may be a dry etching process such as a plasma etching, a reactive ion etching, an inductively coupled plasma etching or the like, and an etching gas may be a gas containing fluorine or chlorine such as $CF_4$, $CHF_3$, $SF_6$ or $CCl_2F_2$, or a mixed gas of the above gases and $O_2$.

In step S113, pixel electrodes are formed on the planarization layer to cover the through holes.

Figure 15:
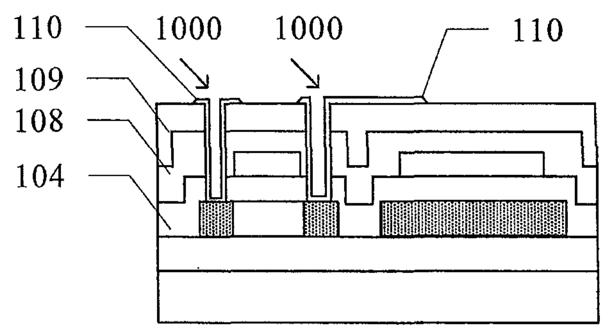
FIG. 15 shows the structure after forming pixel electrodes according to the method.

As shown in FIG. 15, after forming through holes 1000 within the planarization layer 109, the second insulating layer 108 and the gate insulating layer 104, a transparent conductive layer is formed on the planarization layer 109 through processes such as sputtering, thermal evaporation, PECVD, LPCVD, APCVD or ECR-CVD, and then is etched by a wet or dry etching process so as to form pixel electrodes 110 covering the through holes 1000. Thicknesses of the pixel electrodes 110 may be in a range of 1,000 angstroms to 8,000 angstroms, and preferably, in a range of 1,500 angstroms to 4,000 angstroms.

According to the method of manufacturing the pixel unit of the embodiment of the present invention, after forming the polysilicon layer on the substrate, only a single patterning process and a single doping process are used to form the heavily doped regions of the thin film transistor and the lower electrode of the storage capacitor. With this method, since only a single patterning process and a single doping process are used to form the heavily doped regions of the thin film transistor and the lower electrode of the storage capacitor, this method, compared to the prior art, can reduce numbers of patterning processes required to manufacture the LTPS-TFT, shorten time periods for development and mass production, reduce complexity of processes as well as monitoring difficulty and decreasing the production cost.

Figure 16:
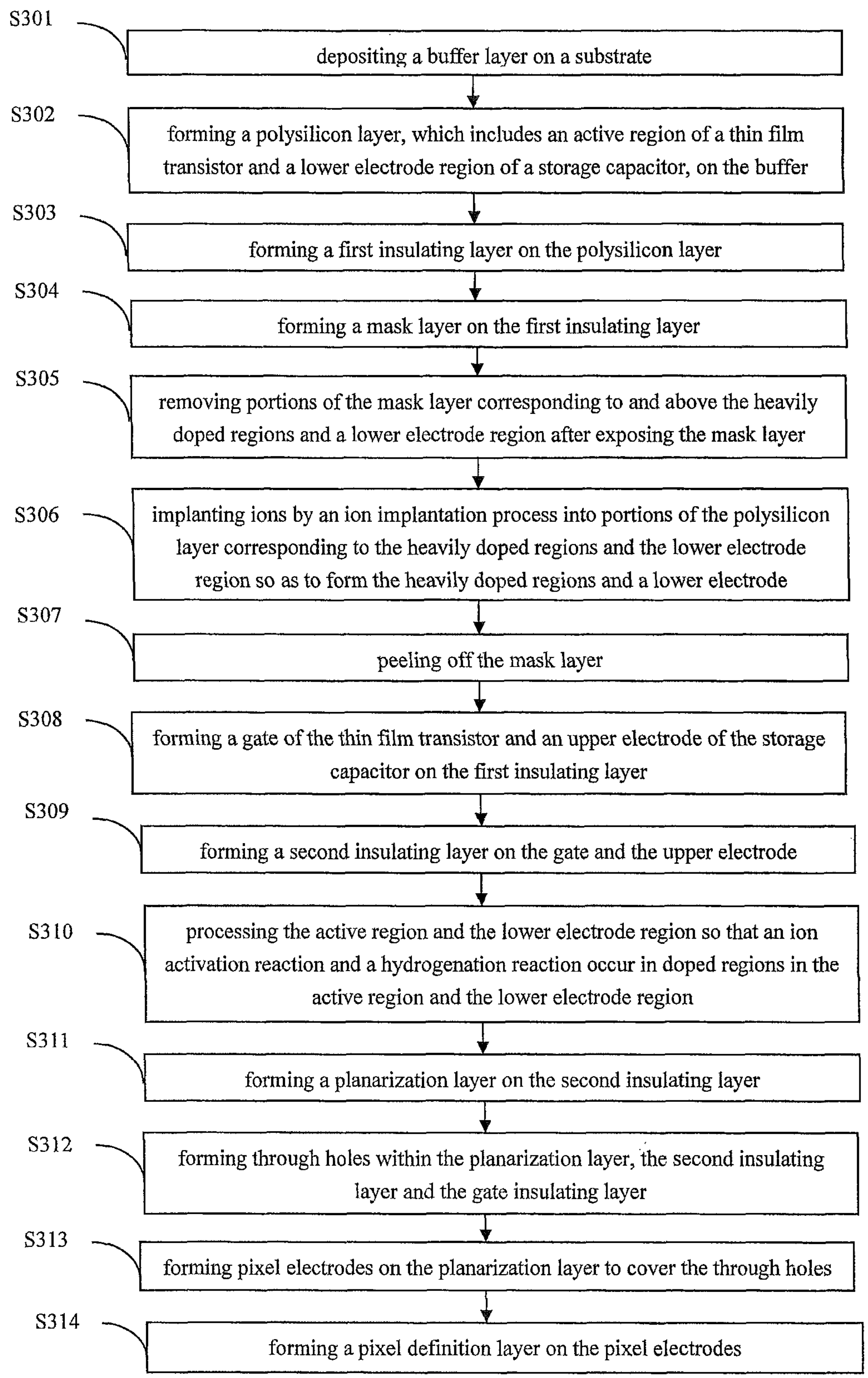
FIG. 16 is a flow chart of a method of manufacturing a pixel unit including a thin film transistor according to another embodiment of the present invention.

Next, a method of manufacturing a pixel unit according to another embodiment of the present invention will be described with reference to FIG. 16.

In step S301, a buffer layer is deposited on a substrate.

In step S302, a polysilicon layer, which includes an active region of a thin film transistor and a lower electrode region of a storage capacitor, is formed on the buffer layer.

In step S303, a first insulating layer is formed on the polysilicon layer, portions of the first insulating layer are used as a gate insulating layer of the thin film transistor and a dielectric layer of the storage capacitor.

In step S304, a mask layer is formed on the first insulating layer.

In step S305, after exposing the mask layer, portions of the mask layer corresponding to and over the heavily doped regions of the thin film transistor and the lower electrode region of the storage capacitor are removed.

In step S306, ions are implanted by way of an ion implantation process into portions of the polysilicon layer corresponding to the heavily doped regions and the lower electrode region, so that the heavily doped regions of the thin film transistor and the lower electrode of the storage capacitor are formed respectively.

In step S307, the mask layer is peeled off.

In step S308, a gate of the thin film transistor and an upper electrode of the storage capacitor are formed on the first insulating layer.

In step S309, a second insulating layer is formed on the gate and the upper electrode.

In step S310, the heavily doped regions and the lower electrode region of the storage capacitor are processed by using an annealing process so that an ion activation reaction and a hydrogenation reaction occur in the heavily doped regions and the lower electrode region.

In step S311, a planarization layer is formed on the second insulating layer.

In step S312, through holes are formed within the planarization layer, the second insulating layer and the gate insulating layer.

In step S313, pixel electrodes are formed on the planarization layer to cover the through holes.

Steps S301 to S313 are the same as steps S101 to S113 described in the above embodiment, and thus will not be repeatedly described.

In step 314, a pixel definition layer is formed on the pixel electrodes.

Figure 17:
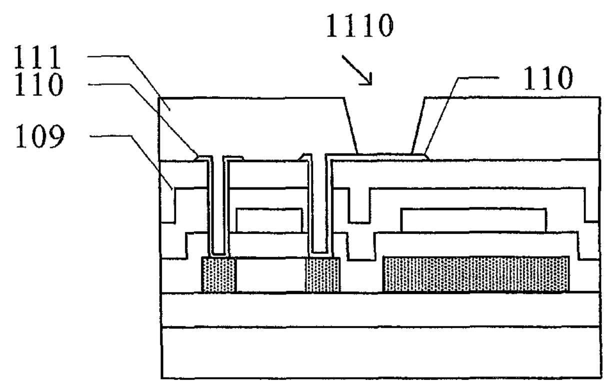
FIG. 17 shows the structure after forming a pixel definition layer according to the method show in FIG. 16.

As shown in FIG. 17, when the pixel unit manufactured according the method of the embedment of the present invention is used in an OLED (Organic Light-Emitting Diode) display device, a pixel definition layer 111 is formed on the pixel electrodes 110 after forming the pixel electrodes 110 on the planarization layer 109. The pixel definition layer 111 is formed with an opening 1110 therein for accommodating a light emitting material. The material of the pixel definition layer 111 may be acrylic or PI (Polyimide) material, and the thickness of the pixel definition layer 111 may be in a range of 8,000 angstroms to 25,000 angstroms.

It is noted that, although the thin film transistor manufactured according to the method of manufacturing a pixel unit according to the embodiment of the present invention has a “top gate” arrangement, in which the active region is arranged between the substrate and the gate insulating layer and the gate is formed over the gate insulating layer, the present invention is also applicable to a thin film transistor having a “bottom gate” arrangement, in which the gate insulating layer covers the gate and the active region is arranged over the gate insulating layer.

In the method of manufacturing a pixel unit according to this embodiment of the present invention, after forming the polysilicon layer on the substrate, only a single patterning process and a single doping process are used to form the heavily doped regions of the thin film transistor and the lower electrode of the storage capacitor. In this solution, since only a single patterning process and a single doping process are used to form the heavily doped regions of the thin film transistor and the lower electrode of the storage capacitor, this method, compared to the prior art, can reduce numbers of patterning processes required to manufacture the LTPS-TFT, shorten time periods for development and mass production, reduce complexity of processes as well as monitoring difficulty, and decrease the production cost.

Figure 18:
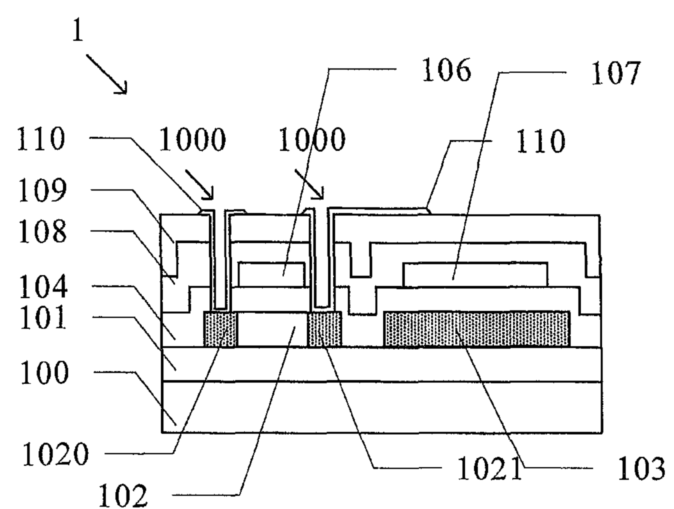
FIG. 18 is a structural diagram of a pixel unit including a thin film transistor according to an embodiment of the present invention.

In the method according to the above embodiment of the present invention, there is provided a pixel unit, as shown in FIG. 18, including:

a substrate 100; and a thin film transistor and a storage capacitor formed on the substrate, wherein heavily doped regions of the thin film transistor and a lower electrode of the storage capacitor have the same materials. Preferably, the heavily doped regions of the thin film transistor and the lower electrode of the storage capacitor are formed on the same polysilicon layer simultaneously through a single patterning process and a single doping process.

Specifically, the heavily doped regions of the thin film transistor and the lower electrode of the storage capacitor are formed by the method according to the above embodiment, in which after performing a single patterning process on the polysilicon layer formed on the substrate 100 so as to form the active region 102 and the lower electrode region 103 of the storage capacitor, a mask layer is formed on the polysilicon layer, and then after exposing the mask layer, the mask layer is removed in regions corresponding to and over the heavily doped regions 1020, 1021 of the thin film transistor and lower electrode region 103 of the storage capacitor, thereafter, ions are implanted into portions of the polysilicon layer corresponding to the heavily doped regions 1020, 1021 of the thin film transistor and lower electrode region 103 of the storage capacitor through a doping process (for example, an ion implantation process), and then the heavily doped regions 1020, 1021 of the thin film transistor and the lower electrode 103 of the storage capacitor are formed though a thermal processing process such as annealing.

Further, the pixel unit 1 also includes:

a first insulating layer 104 formed on the polysilicon layer, portions of the first insulating layer being used as a gate insulating layer of the thin film transistor and a dielectric layer of the storage capacitor.

Further, the pixel unit includes:

a gate 106 of the thin film transistor and an upper electrode 107 of the storage capacitor which are formed on the first insulating layer 104; and a second insulating layer 108 formed on the gate 106 and the upper electrode 107.

Further, the pixel unit includes:

a planarization layer 109 formed on the insulating layer 108;

through holes 1000 formed within the planarization layer 109, the insulating layer 108 and the gate insulating layer 104; and pixel electrodes 110 formed on the planarization layer 109 to cover the through holes 1000.

Further, the pixel unit includes a buffer layer 101 formed between the substrate 100 and the polysilicon layer.

In the pixel unit provided according to the embodiment of the present invention, it is possible to implant ions into portions of the polysilicon layer corresponding to the heavily doped regions of the thin film transistor and the lower electrode region of the storage capacitor at one time during the ion implantation process, so that the heavily doped regions of the thin film transistor and the lower electrode of the storage capacitor are formed, thereby, when compared to the prior art, reducing numbers of patterning processes required to manufacture the LTPS-TFT, shortening time periods for development and mass production, reducing complexity of processes as well as monitoring difficulty, and decreasing the production cost.

Figure 19:
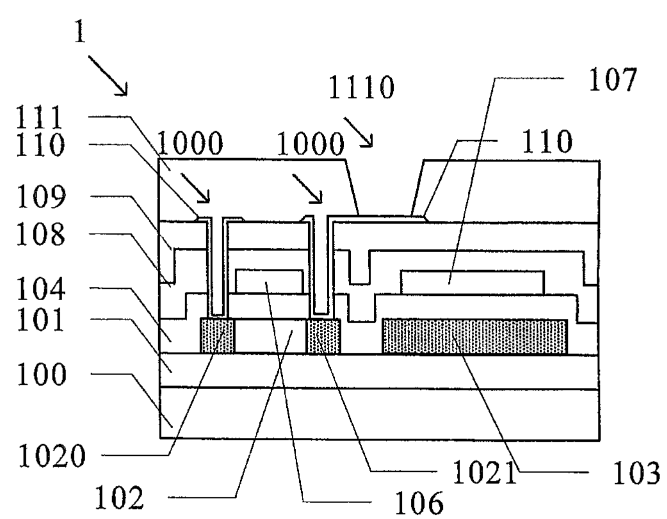
FIG. 19 is a structural diagram of a pixel unit including a thin film transistor according to another embodiment of the present invention.

A further embodiment of the present invention provides a pixel unit as shown in FIG. 19, which, except for parts described above with reference to FIG. 18, may also include a pixel definition layer 111 covering the pixel electrodes 110 and the second insulating layer 108.

An opening 1110 is formed in the pixel definition layer 111 to accommodate an organic light emitting material.

Still further, the active region of the thin film transistor may include lightly doped regions, which may be formed on inner sides of the two heavily doped regions by another patterning process and another doping process after forming the heavily doped regions so as to obtain a five-region LTPS-TFT, thereby improving performances of the TFT.

In the pixel unit including a thin film transistor and provided according to the embodiment of the present invention, it is possible to implant ions into portions of the polysilicon layer corresponding to the heavily doped regions of the thin film transistor and the lower electrode region of the storage capacitor at one time during the ion implantation process, so that the heavily doped regions of the thin film transistor and the lower electrode of the storage capacitor are formed, thereby, when compared to the prior art, reducing numbers of patterning processes required to manufacture the LTPS-TFT, shortening time periods for development and mass production, reducing complexity of processes as well as monitoring difficulty, and decreasing the production cost.

An embodiment of the present invention further provides an array substrate including a plurality of pixel units as described in the above embodiments.

An embodiment of the present invention further provides a display device including the above array substrate. The display device may be a liquid crystal display device including color-film substrates arranged in parallel, the array substrate of the above embodiment, and liquid crystal filled between the color-film substrates and the array substrate; the display device may also be an OLED display device including the array substrate of the above embodiment, an organic light emitting material evaporated on the array substrate, and a package cover plate.

The liquid crystal display device provided in embodiments of the present invention may be used in a liquid crystal display, a liquid crystal television, a digital picture frame, a mobile phone, a tablet computer or other products including a display function, and the present invention is not limited to this.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A method of manufacturing a pixel unit, including steps of:

forming a polysilicon layer on a substrate;

performing a single patterning process on the polysilicon layer so as to form an active region of a thin film transistor and a lower electrode region of a storage capacitor;

forming a first insulating layer on the polysilicon layer, portions of the first insulating layer being used as a gate insulating layer of the thin film transistor and a dielectric layer of the storage capacitor;

performing a single doping process on the active region and the lower electrode region so as to form heavily doped regions of the thin film transistor and a lower electrode of the storage capacitor respectively;

forming a gate of the thin film transistor and an upper electrode of the storage capacitor on the first insulating layer;

forming, before performing an ion activation treatment in the heavily doped regions and the lower electrode region, a second insulating layer on the first insulating layer, the gate and the upper electrode; and after forming the second insulating layer, processing the substrate at a temperature above 400° C. so that an ion activation reaction and a hydrogenation reaction occur in the active region and the lower electrode region.

2. The method of manufacturing a pixel unit according to claim 1, wherein, after the ion activation reaction and the hydrogenation reaction have occurred in the active region and the lower electrode region, the method further includes steps of:

forming a planarization layer on the second insulating layer;

forming through holes within the planarization layer, the second insulating layer and the gate insulating layer; and forming pixel electrodes on the planarization layer to cover the through holes.

3. The method of manufacturing a pixel unit according to claim 2, further including step of:

forming a pixel definition layer to cover the pixel electrodes and the second insulating layer, wherein in the pixel definition layer is formed therein with an opening for accommodating a light emitting material.

4. The method of manufacturing a pixel unit according to claim 1, wherein the heavily doped regions include a source region and a drain region of the thin film transistor.

5. The method of manufacturing a pixel unit according to claim 4, further including step of:

forming lightly doped regions on inner sides of the heavily doped regions.

6. The method of manufacturing a pixel unit according to claim 1, wherein, the step of forming the polysilicon layer includes:

forming a amorphous silicon film on the substrate; and converting the amorphous silicon film into the polysilicon layer.

7. The method of manufacturing a pixel unit according to claim 6, wherein, the step of converting the amorphous silicon film into the polysilicon layer includes:

converting the amorphous silicon film into the polysilicon layer through one or more of an excimer laser crystallization process, a metal induced crystallization process, and a solid phase crystallization process.

8. The method of manufacturing a pixel unit according to claim 1, wherein, before forming the polysilicon layer, the method further includes:

forming a buffer layer on the substrate.

* * * * *